(12) United States Patent
Kim et al.

(10) Patent No.: US 9,105,875 B2
(45) Date of Patent: Aug. 11, 2015

(54) ORGANIC LIGHT-EMITTING DISPLAY APPARATUS

(71) Applicant: Samsung Display Co., Ltd., Yongin (KR)

(72) Inventors: Gee-Bum Kim, Yongin (KR); Min-Woo Kim, Yongin (KR); Hae-Yun Choi, Yongin (KR)

(73) Assignee: Samsung Display Co., Ltd., Yongin (KR)

(*) Notice: Subject to any disclaimer, the term of this patent is extended or adjusted under 35 U.S.C. 154(b) by 0 days.

(21) Appl. No.: 14/269,982

(22) Filed: May 5, 2014

(65) Prior Publication Data

US 2015/0188093 A1 Jul. 2, 2015

(30) Foreign Application Priority Data

Dec. 31, 2013 (KR) .................. 10-2013-0168835

(51) Int. Cl.
*H01L 27/32* (2006.01)
*H01L 51/52* (2006.01)

(52) U.S. Cl.
CPC ........ *H01L 51/5275* (2013.01); *H01L 27/3244* (2013.01); *H01L 51/5218* (2013.01)

(58) Field of Classification Search
CPC ............ H01L 27/3246; H01L 27/3248; H01L 27/3258; H01L 2227/323; H01L 51/5218; H01L 51/5271; H01L 2251/5323; H01L 2924/12044
USPC ................................. 257/59, 72, 83
See application file for complete search history.

(56) References Cited

U.S. PATENT DOCUMENTS

| | | |
|---|---|---|
| 5,998,803 A | 12/1999 | Forrest et al. |
| 2009/0200936 A1* | 8/2009 | Kang et al. ............ 313/505 |
| 2009/0236981 A1* | 9/2009 | Chang et al. ............ 313/504 |
| 2012/0223346 A1 | 9/2012 | Ohsawa et al. |
| 2013/0240914 A1* | 9/2013 | Jin et al. ................. 257/88 |
| 2014/0061605 A1 | 3/2014 | Kim et al. |

FOREIGN PATENT DOCUMENTS

| | | |
|---|---|---|
| JP | 2005-327535 | 11/2005 |
| KR | 10-2000-0062302 | 10/2000 |
| KR | 10-2012-0100813 | 9/2012 |
| KR | 10-20130030148 | 3/2013 |
| KR | 10-2014-0030842 | 3/2014 |

* cited by examiner

*Primary Examiner* — Minh-Loan Tran
(74) *Attorney, Agent, or Firm* — H.C. Park & Associates, PLLC

(57) ABSTRACT

An organic light-emitting display apparatus including a substrate; an insulating layer disposed on the substrate; a first pixel electrode disposed on the insulating layer and including a reflecting layer; a pixel defining layer disposed around one end of the first pixel electrode and extending away from the first pixel electrode; a first intermediate layer disposed on the first pixel electrode and including an organic emission layer; an opposite electrode disposed on the first intermediate layer and the pixel defining layer and including a reflecting layer; and a first refractive layer disposed between the insulating layer and the pixel defining layer and having a refractivity greater than that of the insulating layer and the pixel defining layer. A first end of the first refractive layer is disposed to contact the first intermediate layer, and a second end of the refractive layer is disposed to face a portion of the opposite electrode.

20 Claims, 3 Drawing Sheets

ORGANIC LIGHT-EMITTING DISPLAY APPARATUS

CROSS-REFERENCE TO RELATED APPLICATION

This application claims priority from and the benefit of Korean Patent Application No. 10-2013-0168835, filed on Dec. 31, 2013, which is hereby incorporated by reference for all purposes as if fully set forth herein.

BACKGROUND

1. Field

Exemplary embodiments of the present invention relate to an organic light-emitting display apparatus.

2. Discussion of the Background

An organic light-emitting display apparatus includes an organic light-emitting device including a hole injection electrode, an electron injection electrode, and an organic emission layer disposed between the hole injection electrode and the electron injection electrode. The organic light-emitting display apparatus is a self-emissive display apparatus in which holes and electrons injected from the hole injection electrode and the electron injection electrode, respectively, are combined in the organic emission layer to produce excitons. These excitons change from an excited state to a ground state, thereby generating light.

Because the organic-light emitting display apparatus, which is a self-emissive display apparatus, does not require a separate light source, the organic light-emitting display apparatus may be driven by a low voltage, and manufactured to be lightweight and thin. In addition, the organic light-emitting display apparatus may have high quality characteristics, such as a wide viewing angle, high contrast, and a fast response speed. Therefore, the organic light-emitting display apparatus may be applicable in areas extending from a personal mobile device, such as an MP3 player or a cell phone, to a television.

The above information disclosed in this Background section is only for enhancement of understanding of the background of the invention and, therefore, it may contain information that does not form the prior art that is already known in this country to a person of ordinary skill in the art.

SUMMARY

Exemplary embodiments of the present invention provide an organic light-emitting display apparatus.

Additional aspects will be set forth in part in the description which follows and, in part, will be apparent from the description, or may be learned by practice of the invention.

An exemplary embodiment of the present invention discloses an organic light-emitting display apparatus including: a substrate; an insulating layer disposed on the substrate; a first pixel electrode disposed on the insulating layer and including a reflecting layer; a pixel defining layer disposed to be extended from one end portion of the first pixel electrode toward an outer region of the first pixel electrode; a first intermediate layer disposed on the first pixel electrode and including an organic emission layer; an opposite electrode disposed on the first intermediate layer and the pixel defining layer and including a reflecting layer; and a refractive layer disposed between the insulating layer and the pixel defining layer. The refractive layer has a refractive index greater than that of both the insulating layer and the pixel defining layer, and one end of the refractive layer contacts the first intermediate layer, and the other end of the refractive layer faces a region of the opposite electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
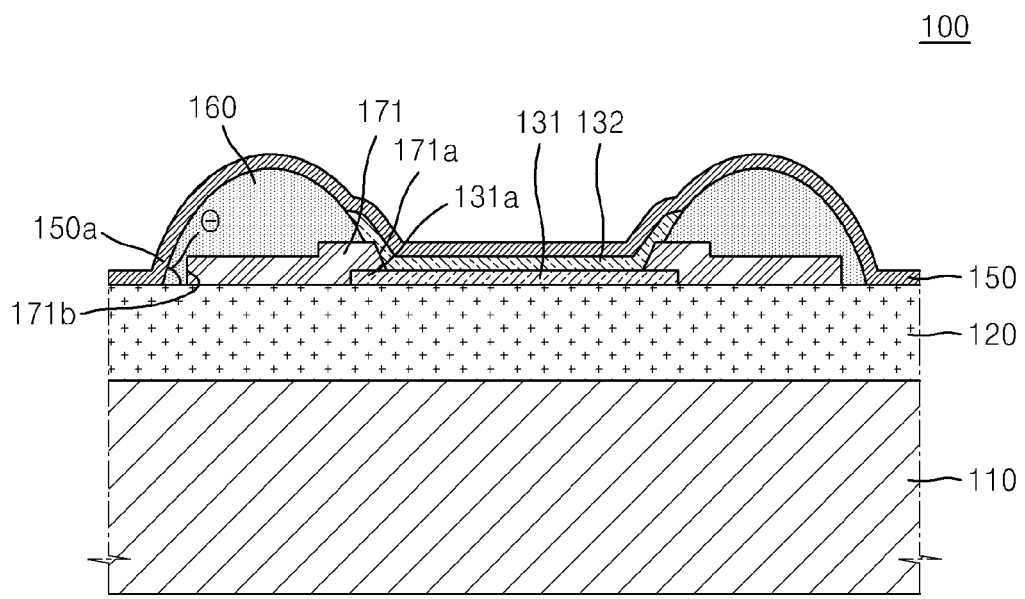
FIG. 1 is a cross-sectional view schematically illustrating an organic light-emitting display apparatus according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of elements may be exaggerated for clarity. Like reference numerals in the drawings denote like elements.

It will be understood that although the terms "first" and "second" are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on"; "connected to"; or "coupled to" another element or layer, it can be directly on; directly connected to; or directly coupled to the other element or layer, or intervening elements or layers may be present. In contrast, when an element or layer is referred to as being "directly on"; "directly connected to"; or "directly coupled to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

A specific order of processes may not follow the order described herein. For example, two processes consecutively described herein may be simultaneously performed or may be performed in an order opposite to that described.

FIG. 1 is a cross-sectional view schematically illustrating an organic light-emitting display apparatus 100 according to an exemplary embodiment of the present invention.

Referring to FIG. 1, the organic light-emitting display apparatus 100 may include a substrate 110, an insulating layer 120 disposed on the substrate 110, a first pixel electrode 131 disposed on the insulating layer 120 and including a reflecting layer, a pixel defining layer 160 extended from one end portion 131a of the first pixel electrode 131 toward an outer region of the first pixel electrode 131, a first intermediate layer 132 disposed on the first pixel electrode 131 and including an organic emission layer, and an opposite electrode 150 disposed on the first intermediate layer 132 and the pixel defining layer 160 and including a reflecting layer.

The organic light-emitting display apparatus 100 may include a refractive layer 171 disposed between the insulating layer 120 and the pixel defining layer 160. The refractive layer 171 has a refractive index greater than that of both the insulating layer 120 and the pixel defining layer 160, in which one end 171a of the refractive layer 171 contacts the first intermediate layer 132, and the other end 171b of the refractive layer 171 faces a region 150a of the opposite electrode 150.

The first pixel electrode 131 may include a reflecting layer. For example, the reflecting layer may include at least one of silver (Ag), magnesium (Mg), aluminum (Al), platinum (Pt), palladium (Pd), gold (Au), nickel (Ni), neodymium (Nd), iridium (Ir), and chrome (Cr). A transparent electrode layer or a semi-transparent electrode layer, which is formed of at least one of indium tin oxide (ITO), indium zinc oxide (IZO), zinc oxide (ZnO), indium oxide (In$_2$O$_3$), indium galium oxide (IGO), and aluminum zinc oxide (AZO), may be further disposed on the reflecting layer.

For example, the first pixel electrode 131 may have a three-layered structure of ITO/Ag/ITO. When the Ag layer is formed to a thickness of about 1000 Å or greater, the Ag layer may increase the reflectivity thereof and, accordingly, the first pixel electrode 131 may have a reflectivity of 90% or greater.

The first intermediate layer 132 may include an organic emission layer and at least one layer selected from a hole injection layer (HIL), a hole transport layer (HTL), an electron transport layer (ETL), and an electron injection layer (EIL). However, the exemplary embodiments of the present invention are not limited thereto, and the first intermediate layer 132 may further include other various functional layers, in addition to the organic emission layer. The organic emission layer may emit red, green, blue, or white light.

The first intermediate layer 132 emitting white light may have various structures. For example, the first intermediate layer 132 may have a structure on which luminescent materials emitting red, green, and blue light, respectively, are stacked. The first intermediate layer 132 emitting white light may have a structure in which luminescent materials emitting at least red, green, and blue light, respectively, are mixed.

However, the embodiments of the present invention are not limited to the use of blue, green, and red colors. That is, if white light is able to be emitted, a combination of colors other than a combination of red, green, and blue colors may be used.

The opposite electrode 150 may include a reflecting layer, and the reflecting layer may be formed of at least one of Ag, Mg, Al, lithium (Li), calcium (Ca), copper (Cu), LiF/Ca, LiF/Al, MgAg, and CaAg. The reflecting layer may have a reflectivity of 90% or greater.

The organic light-emitting display apparatus 100 may include the first pixel electrode 131 and the opposite electrode 150, in which the first pixel electrode 131 and the opposite electrode 150 include the reflecting layer. Thus, light cannot be emitted in a direction toward the first pixel electrode 131 or the opposite electrode 150. That is, an optical waveguide may be formed by the first pixel electrode 131 and the opposite electrode 150 in an emission region on which the first intermediate layer 132 is disposed, such that light emitted from the first intermediate layer 132 may be released to the outside through a region outside the emission region, on which the first pixel electrode 131 is not disposed. That is, the light may be propagated in a direction toward a region on which the pixel defining layer 160 is disposed, so as to be released to the outside.

The organic light-emitting display apparatus 100 may include the refractive layer 171, one end 171a of which contacts the first intermediate layer 132, and light that is laterally propagated along the optical waveguide formed by the first pixel electrode 131 and the opposite electrode 150 may be incident on the refractive layer 171, the refractive layer 171 contacting the first intermediate layer 132.

The refractive layer 171 may be disposed on the one end portion 131a of the first pixel electrode 131, and may have a refractive index that is equal to or greater than that of the organic emission layer included in the first intermediate layer 132.

In this regard, total reflection occurs at an interface between the first intermediate layer 132 and the refractive layer 171, and optical loss caused by light propagated to other regions may be reduced, thereby increasing a quantity of incident light transmitted from the first intermediate layer 132 to the refractive layer 171.

The pixel defining layer 160 and the insulating layer 120 may each be disposed on a top surface and a bottom surface of the refractive layer 171, and the refractive layer 171 may have a refractive index greater than that of both the pixel defining layer 160 and the insulating layer 120.

Therefore, the optical waveguide may be formed by the pixel defining layer 160, the refractive layer 171, and the insulating layer 120. That is, light that is incident above a preset angle (i.e., an angle of total reflection) on an interface between the pixel defining layer 160 and the refractive layer 171, and an interface between the refractive layer 171 and the insulating layer 120 may be repeatedly reflected at these interfaces. Accordingly, the incident light from one end 171a of the refractive layer 171 may be reflected, and then propagated to the other end 171b of the refractive layer 171.

The light that is emitted from the other end 171b of the refractive layer 171 may be directly released to the outside, or indirectly released to the outside by being reflected by the opposite electrode 150.

The other end 171b of the refractive layer 171 may be disposed to face a region 150a of the opposite electrode 150, and the region 150a may have an inclination angle θ with respect to the substrate 110. The inclination angle θ may be in a range of 40° to less than 90°.

When the inclination angle θ is less than 40°, an angular range at which the reflected light from the region 150a of the opposite electrode 150 is emitted widens. Accordingly, the organic light-emitting display apparatus 100 may cause degradation in the efficiency of front light extraction. When the inclination angle θ is 90° or greater, the reflected light from the region 150a of the opposite electrode 150 may proceed toward the top surface of the refractive layer 171. Accordingly, an amount of light released to the outside via the substrate 110 may be reduced. That is, the organic light-emitting display apparatus 100 with an inclination angle θ less than 40°, or 90° or greater may degrade the efficiency of light extraction.

The organic light-emitting display apparatus 100 in which the refractive layer 171 is disposed between the pixel defining layer 160 and the insulating layer 120 may propagate light emitted from the first intermediate layer 132 to the other end 171b of the refractive layer 171, the other end 171b facing the region 150a of the opposite electrode 150. Accordingly, the organic light-emitting display apparatus 100 may reduce a reflection area of the opposite electrode 150, and may also reduce an angular range at which the light is released to the outside.

Therefore, the organic light-emitting display apparatus 100 may enhance efficiency of light extraction by reducing a quantity of light loss caused by total reflection occurring at an interface between the substrate 110 and external air, which has a refractive index smaller than that of the substrate 110.

Figure 2:
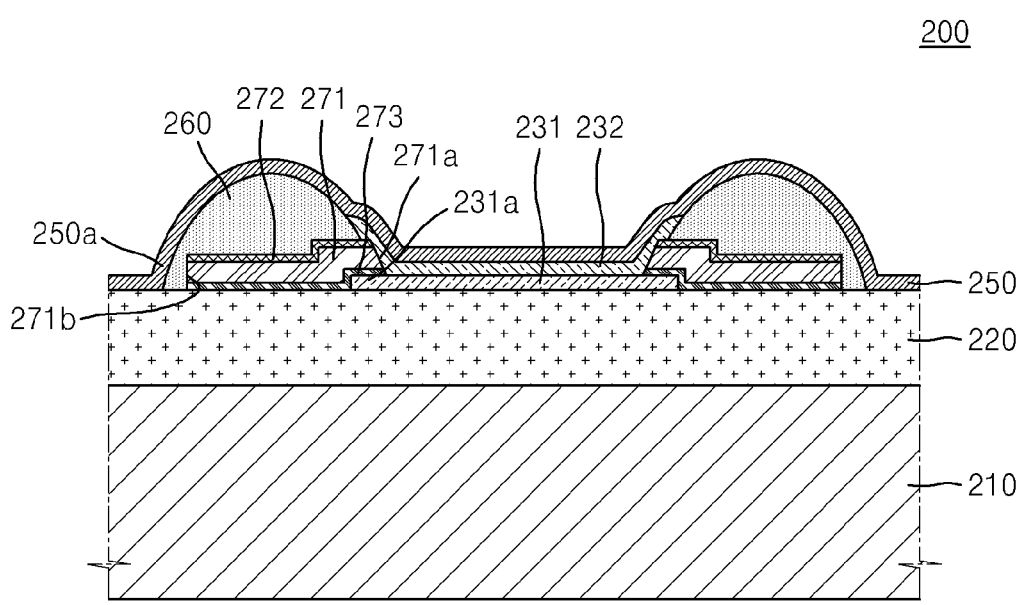
FIG. 2 is a cross-sectional view schematically illustrating an organic light-emitting display apparatus according to an exemplary embodiment of the present invention.
Figure 3:
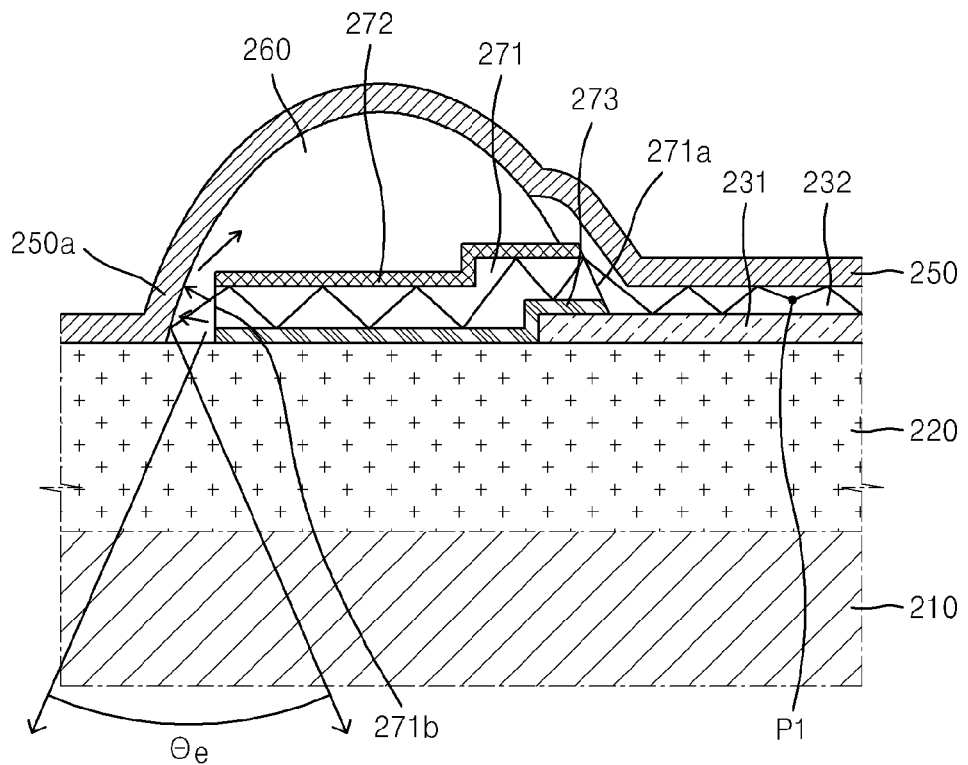
FIG. 3 is a conceptual diagram illustrating the principle of light extraction of the organic light-emitting display apparatus of FIG. 2.

FIG. 2 is a cross-sectional view schematically illustrating an organic light-emitting display apparatus 200 according to an exemplary embodiment of the present invention, and FIG. 3 is a conceptual diagram illustrating the principle of light extraction of the organic light-emitting display apparatus 200 of FIG. 2.

Referring to FIG. 2, the organic light-emitting display apparatus 200 may include a substrate 210, an insulating layer 220 disposed on the substrate 210, a first pixel electrode 231 disposed on the insulating layer 220 and including a reflecting layer, a pixel defining layer 260 extended from one end portion 231a of the first pixel electrode 231 toward an outer region of the first pixel electrode 231, a first intermediate layer 232 disposed on the first pixel electrode 231 and including an organic emission layer, and an opposite electrode 250 disposed on the first intermediate layer 232 and the pixel defining layer 260, the opposite electrode 250 including a reflecting layer.

The organic light-emitting display apparatus 200 may include a first refractive layer 271 disposed between the insulating layer 220 and the pixel defining layer 260 and having a refractive index greater than that of both the insulating layer 220 and the pixel defining layer 260. One end 271a of the first refractive layer 271 contacts first intermediate layer 232, and the other end 271b of the first refractive layer 271 faces a region 250a of the opposite electrode 250. In addition, the light-emitting display apparatus 200 may include a second refractive layer 272 disposed to contact with a top surface of the refractive layer 271 and having a refractive index less than that of the pixel defining layer 260, and a third refractive layer 273 disposed on a bottom surface of the first refractive layer 271 and having a refractive index less than that of the insulating layer 220.

The first refractive layer 271 may include $SiN_x$, $TiO_x$, or $Al_2O_3$, and may have a refractive index of 1.7 or greater. The second refractive layer 272 and the third refractive layer 273 may include $SiO_x$ or an acryl-based organic material, and may have a refractive index of 1.5 or less.

The organic light-emitting display apparatus 200 may include the first pixel electrode 231 and the opposite electrode 250, in which the first pixel electrode 230 and the opposite electrode 150 include the reflecting layer. Thus, light cannot be emitted in a direction toward the first pixel electrode 231 or the opposite electrode 250. That is, an optical waveguide may be formed by the first pixel electrode 231 and the opposite electrode 250 in an emission region on which the first intermediate layer 232 is disposed, and accordingly, light emitted from the first intermediate layer 232 may be released to the outside through an outside region of the emission region on which the first pixel electrode 231 is not disposed. That is, the light may be propagated in a direction to a region on which the pixel defining layer 260 is disposed, so as to be released to the outside.

The organic light-emitting display apparatus 200 may include the first refractive layer 271 of which one end 271a is disposed to contact with first intermediate layer 232, and light that is laterally propagated along the optical waveguide formed by the first pixel electrode 231 and the opposite electrode 250 may be incident on the first refractive layer 271, the first refractive layer contacting the first intermediate layer 232.

The first refractive layer 271 may be disposed on the one end portion 231a of the first pixel electrode 231, and may have a refractive index that is equal to or greater than that of the organic emission layer included in the first intermediate layer 232.

The second refractive layer 272 and the third refractive layer 273 may be each disposed on a top surface and a bottom of the refractive layer 271.

Therefore, the optical waveguide may be formed into the second refractive layer 272, the first refractive layer 271, and the third refractive layer 273. That is, light that is incident at above a preset angle (i.e., an angle of total reflection) on an interface between the second refractive layer 272 and the first refractive layer 271, and an interface between the first refractive layer 271 and the third refractive layer 273 may be repeatedly reflected at these interfaces. Accordingly, the incident light from one end 271a of the first refractive layer 271 may be reflected, and then propagated to the other end 271b of the first refractive layer 271.

The light emitted from the other end 271b of the first refractive layer 271 may be directly emitted to the outside, or indirectly emitted to the outside by being reflected by the opposite electrode 250.

In comparison with the organic light-emitting display apparatus 100 of FIG. 1, a refractive index of the second refractive layer 272 is smaller than that of the pixel defining layer 260, and a refraction index of the third refractive layer 273 is smaller than that of the insulating layer 220. In this regard, an extent of a critical angle at which total reflection may occur at an interface between the second refractive layer 272 and the first refractive layer 271, and an interface between the first refractive layer 271 and the third refractive layer 273, may become smaller.

Therefore, an amount of light, which is propagated along the optical waveguide formed according to the second refractive layer 272, the first refractive layer 271, and the third refractive layer 273, may be increased, and accordingly, the organic light-emitting display apparatus 200 may enhance efficiency of light extraction.

Referring to FIG. 3, light emitted from a region P1 of the first intermediate layer 232 may be reflected by the first pixel electrode 231 and the opposite electrode 250, in which the first pixel electrode 231 and the opposite electrode 250 both include the reflecting layer. Then, the light emitted therefrom may be propagated laterally along the first pixel electrode 231, so as to be incident on the first refractive layer 271, of which one end 271a is disposed to contact with first intermediate layer 232.

The light incident on the first refractive layer 271 may be repeatedly reflected at an interface between the second refractive layer 272 and the first refractive layer 271, and an interface between the first refractive layer 271 and the third refractive layer 273, so as to be propagated to the other end 271b of the refractive layer 271. Here, a part of the light incident on the first refractive layer 271 may pass through in a direction toward the pixel defining layer 260 or the insulating layer 220.

The light propagated to the other end 271b of the first refractive layer 271 may be emitted at various angles therefrom. A portion of the emitted light may be reflected by the opposite electrode 250, and then proceed in a direction toward the substrate 210 (see FIG. 2). Another portion of the emitted light may proceed directly in a direction toward the substrate 210. The other portion of the emitted light may be reflected by the opposite electrode 250, and then proceed in a direction toward the pixel defining layer 260. The light from the pixel defining layer 260 may be reflected again by the opposite electrode 250 disposed on the pixel defining layer 260, and then proceed along various routes.

As a result, an angular range $\theta_e$, at which the light proceeds in a direction toward the substrate 210 is smaller than that of a case that does not include the first refractive layer 271. Therefore, the organic light-emitting display apparatus 200 may enhance efficiency of light extraction by reducing an amount of light loss caused by total reflection occurring at an interface between the substrate 210 and external air, which has a refractive index smaller than that of the substrate 210.

Figure 4:
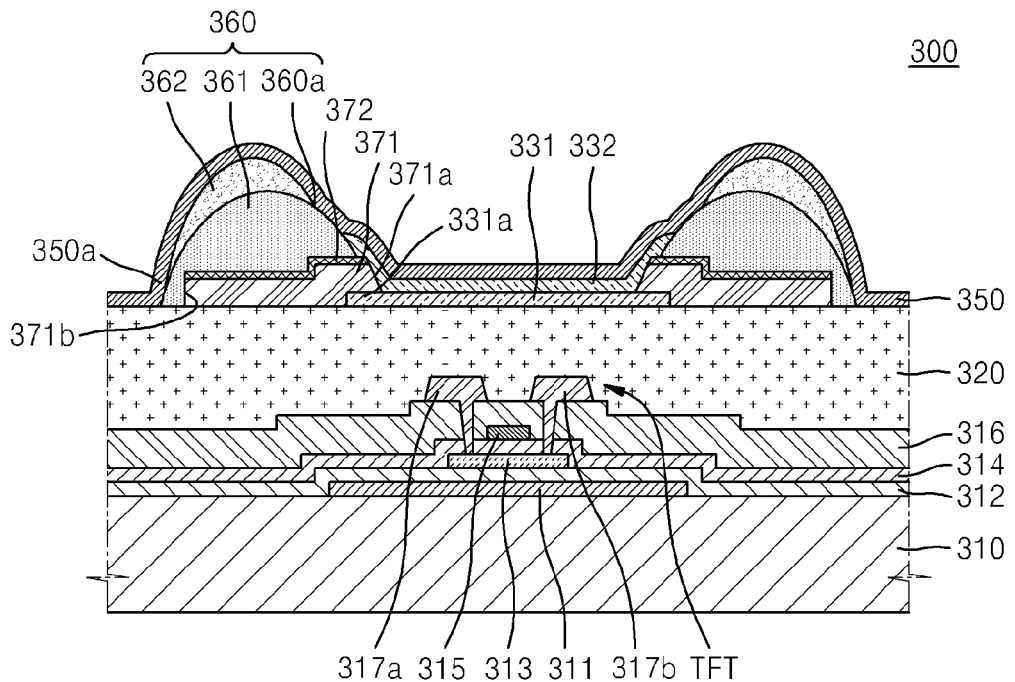
FIG. 4 is a cross-sectional view schematically illustrating an organic light-emitting display apparatus according to an exemplary embodiment of the present invention.

FIG. 4 is a cross-sectional view schematically illustrating an organic light-emitting display apparatus 300 according to an exemplary embodiment of the present invention.

Referring to FIG. 4, the organic light-emitting display apparatus 300 may include a substrate 310, a fourth insulating layer 320 disposed on the substrate 310, a first pixel electrode 331 disposed on the fourth insulating layer 320 and including a reflecting layer, a pixel defining layer 360 extended from one end portion 331a of the first pixel electrode 331 toward an outer region of the first pixel electrode 331, a first intermediate layer 332 disposed on the first pixel electrode 331 and including an organic emission layer, and an opposite electrode 350 disposed on the first intermediate layer 332 and the pixel defining layer 360 and including a reflecting layer.

The organic light-emitting display apparatus 300 may include a first refractive layer 371 disposed between the fourth insulating layer 320 and the pixel defining layer 360, the first refractive layer 371 having a refractive index greater than that of both the fourth insulating layer 320 and the pixel defining layer 360, in which one end 371a of the first refractive layer 371 contacts the first intermediate layer 332, and the other end 371b of the refractive layer 371 faces a region 350b of the opposite electrode 350. In addition, the light-emitting display apparatus 300 may include a second refractive layer 372 contacting a top surface of the first refractive layer 371 and having a refractive index smaller than that of the pixel defining layer 360.

A black matrix 311 may be disposed between the substrate 310 and the first pixel electrode 331. The black matrix 311 may be disposed to correspond to the first pixel electrode 331, and may have a width equal to or greater than that of the first pixel electrode 331.

When the black matrix 311 is disposed in a region where light is not emitted outward, external light may be reflected by various metals contained in the organic light-emitting display apparatus 300. Accordingly, visibility degradation of the organic light-emitting display apparatus 300 may be prevented. In this regard, there is no need to use a polarizer, and accordingly, a decrease in efficiency of light resulting from light absorption caused by such a polarizer may be prevented.

A thin film transistor (TFT), which is electrically connected to the first pixel electrode 331, may be disposed on a region corresponding to the first pixel electrode 331 disposed on the substrate 310, which is a region overlapping the first pixel electrode 331 in plan view.

The organic light-emitting display apparatus 300 may separately include a region where light is emitted, and a region where light is emitted outward. Thus, there is no need to secure a separate space for a semiconductor device, such as a TFT, when the semiconductor device is disposed on a region where light is emitted, which is the region corresponding to the first pixel electrode 331.

In this regard, the organic light-emitting display apparatus 300 may improve resolution thereof.

The black matrix 311 and a first insulating layer 312 covering the black matrix 311 may be disposed on the substrate 310 that is formed of glass or transparent plastic.

A TFT formed of an active layer 313, a gate electrode 315, and source and drain electrodes 317a and 317b may be disposed on the first insulating layer 312.

A second insulating layer 314 may be disposed between the active layer 313 and the gate electrode 315, and a third insulating layer 316 may be disposed between the gate electrode 315 and the source and drain electrodes 317a and 317b.

The fourth insulating layer 320 covering the source and drain electrodes 317a and 317b may be formed on the third insulating layer 316. The fourth insulating layer 320 may perform planarization and include organic materials.

The first pixel electrode 331 and the first refractive layer 371 disposed on the one end portion 331a of the first pixel electrode 331 may be disposed on the fourth insulating layer 320, the second refractive layer 372 may be disposed on the first refractive layer 371, and the pixel defining layer 360 may be disposed on the second refractive layer 372.

The pixel defining layer 360 may include a first layer 361 contacting the second refractive layer 372, and a second layer 362 disposed on the first layer 361, and a branch point 360a of an inclination angle that is disposed at an interface between the first and the second layers 361 and 362, and has discontinuous changes of the inclination angle.

A portion of light that is laterally propagated from the first intermediate layer 332 may be incident on the first refractive layer 371, and the other portion of the light may be incident on the pixel defining layer 360. A portion of the light incident on the pixel defining layer 360 may be reflected by the opposite electrode 350 disposed on the pixel defining layer 360, and then released to the outside.

The branch point of an inclination angle 360a may prevent light incident on the pixel defining layer 360 from continuously propagating laterally along an interface between the pixel defining layer 360 and the opposite electrode 350, and then disappearing. Accordingly, the organic light-emitting display apparatus 300 may enhance efficiency of light extraction.

The first and the second layers 361 and 362 may include organic materials, and the organic materials may be the same or different from each other. For example, the first and the second layers 361 and 362 may include polyimide (PI), but the organic material is not limited thereto.

Although not illustrated herein, an encapsulation member may be disposed on the opposite electrode 350. The encapsulation member may be formed of a glass substrate, a metal film, or a thin film encapsulation in which an organic insulating layer and an inorganic insulating layer are alternately arranged.

The second layer 362 of the pixel defining layer 360 may act as a spacer for adjusting the spacing between the encapsulation member and the substrate 310.

The organic light-emitting display apparatus 300 may include the first refractive layer 371 and the second refractive layer 372 that are disposed between the fourth insulating layer 320 and the pixel defining layer 360. Light that is incident on the first refractive layer 371 from the first intermediate layer 332 may be repeatedly reflected at an interface between the first refractive layer 371 and the second refractive layer 372, and an interface between the first refractive layer 371 and the fourth insulating layer 320, so as to be propagated to the other end 371b of the first refractive layer 371. Light that is emitted from the other end 371b of the first refractive layer 371 may be directly released to the outside, or indirectly released to the outside by being reflected by the opposite electrode 350.

Figure 5:
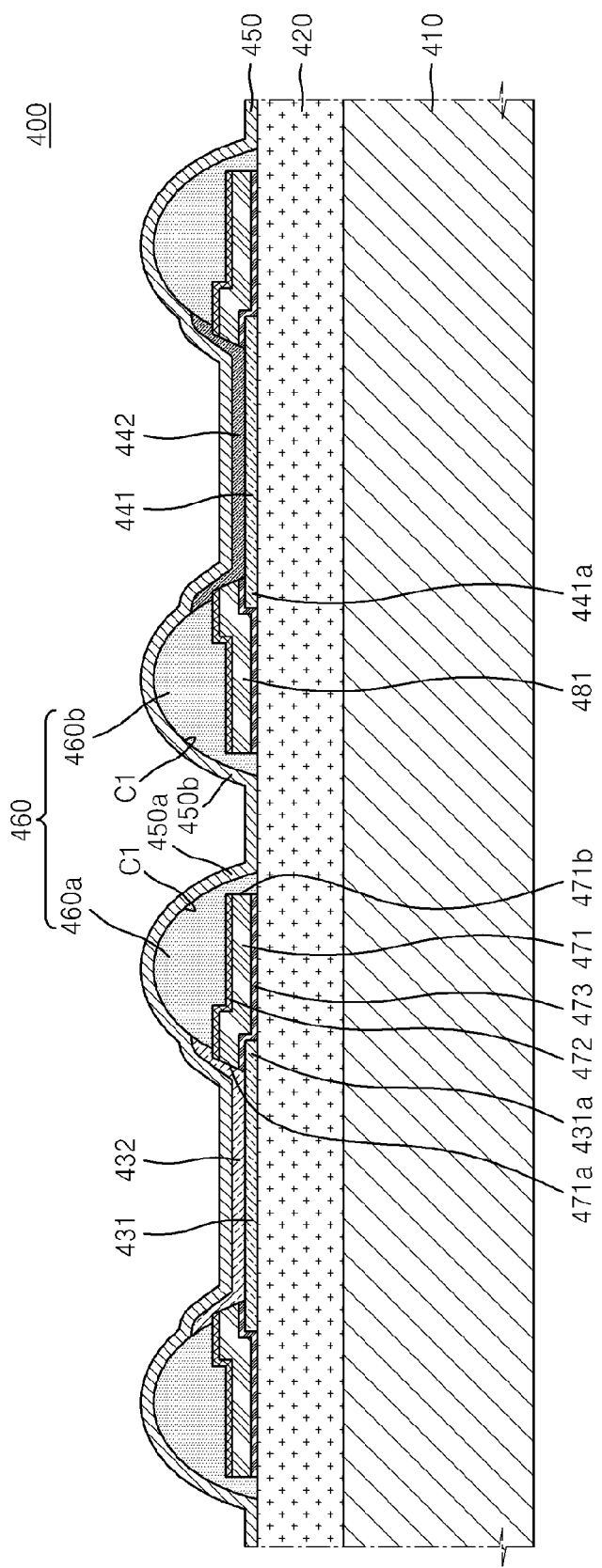
FIG. 5 is a cross-sectional view schematically illustrating an organic light-emitting display apparatus according to an exemplary embodiment of the present invention.

FIG. 5 is a cross-sectional view schematically illustrating an organic light-emitting display apparatus 400 according to an exemplary embodiment of the present invention Referring to FIG. 5, the organic light-emitting display apparatus 400 may include a substrate 410, an insulating layer 420 disposed on the substrate 410, a first pixel electrode 431 disposed on the insulating layer 420 and including a reflecting layer, a pixel defining layer 460 extended from one end portion 431a of the first pixel electrode 431 toward an outer region of the first pixel electrode 431, a first intermediate layer 432 disposed on the first pixel electrode 431 and including an organic emission layer, and an opposite electrode 450 disposed on the first intermediate layer 432 and the pixel defining layer 460 and including a reflecting layer.

The organic light-emitting display apparatus 400 may include a refractive layer 471 disposed between the insulating layer 420 and the pixel defining layer 460 and having a refractive index greater than that of the insulating layer 420 and the pixel defining layer 460, wherein one end 471a of the refractive layer 471 contacts the first intermediate layer 432, and the other end 471b of the refractive layer 471 faces a region 450a of the opposite electrode 450.

The light-emitting display apparatus 400 may further include, on the insulating layer 420, a second pixel electrode 441 that is spaced apart from the first pixel electrode 431, and a second intermediate layer 442 that is disposed on the second pixel electrode 441.

The pixel defining layer 460 may be extended from one end portion 431a of the first pixel electrode 431 toward one end portion 441a of the second pixel electrode 441, and may have at least one opening C1 that is disposed between the first pixel electrode 431 and the second pixel electrode 441 to expose the insulating layer 420.

That is, the pixel defining layer 460 may include, with respect to the opening C1, a first region 460a disposed in a direction toward the first pixel electrode 431, and a second region 450b disposed in a direction to the second pixel electrode 441.

The opposite electrode 450 may be disposed on the first intermediate layer 432, the pixel defining layer 460, and the second intermediate layer 442, and may be disposed to contact with insulating layer 420 through the opening C1 included in the pixel defining layer 460.

Light that is emitted from the first intermediate layer 432 may pass through the refractive layer 471 disposed to contact with first intermediate layer 432, and then, may be reflected by a first region 450a of the opposite electrode 450 disposed on one side surface of the opening C1. The reflected light may be released to the outside. Light that is emitted from the second intermediate layer 442 may pass through the refractive layer 481 contacting the second intermediate layer 442, and then may be reflected by a second region 450b of the opposite electrode 450 disposed on the other surface of the opening C1. The reflected light may be released to the outside.

In this regard, the region 450a, where the light emitted from the first intermediate layer 423 is released to the outside, may be separated from the region 450b, where the light emitted from the second intermediate layer 442 is released to the outside via opening C1.

The pixel defining layer 460 of FIG. 5 includes one opening C1, but the opening C1 is not limited thereto. The pixel defining layer 460 may include two or more openings C1 disposed between the first pixel electrode 431 and the second pixel electrode 441.

As described above, according to the exemplary embodiments of the present invention, an organic light-emitting display apparatus 100, 200, 300, or 400 may enhance efficiency of light extraction by reducing an angular range of light that is released to the outside.

It should be understood that the exemplary embodiments described therein should be considered in a descriptive sense only and not for purposes of limitation. Descriptions of features or aspects within each embodiment should typically be considered as available for other similar features or aspects in other embodiments.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light-emitting display apparatus comprising:
a substrate;
an insulating layer disposed on the substrate;
a first pixel electrode disposed on the insulating layer and comprising a reflecting layer;
a pixel defining layer disposed around one end portion of the first pixel electrode and extending away from the first pixel electrode;
a first intermediate layer disposed on the first pixel electrode and comprising an organic emission layer;
an opposite electrode disposed on the first intermediate layer and the pixel defining layer and comprising a reflecting layer; and
a first refractive layer disposed between the insulating layer and the pixel defining layer, the first refractive layer having a higher refractive index than the insulating layer and the pixel defining layer,
wherein a first end of the first refractive layer is disposed to directly contact the first intermediate layer, and a second end of the first refractive layer faces the opposite electrode.

2. The organic light-emitting display apparatus of claim 1, wherein the first refractive layer covers one end portion of the pixel electrode.

3. The organic light-emitting display apparatus of claim 2, wherein a portion of the opposite electrode that faces the other end of the first refractive layer is inclined at an inclination angle with respect to the substrate.

4. The organic light-emitting display apparatus of claim 3, wherein the inclination angle is in a range of 40° to less than 90°.

5. The organic light-emitting display apparatus of claim 1, wherein the first refractive layer has a refractive index equal to or greater than that of the organic light emission layer.

6. The organic light-emitting display apparatus of claim 1, further comprising a second refractive layer disposed directly on a top surface of the first refractive layer and having a refractive index smaller than that of the pixel defining layer.

7. The organic light-emitting display apparatus of claim 6, further comprising a third refractive layer disposed directly on a bottom surface of the first refractive layer and having a refractive index smaller than that of the insulating layer.

8. The organic light-emitting display apparatus of claim 4, wherein the second refractive layer and the third refractive layer comprise $SiO_x$ or an acryl-based organic material.

9. The organic light-emitting display apparatus of claim 1, wherein the first refractive layer comprises $SiN_x$, $TiO_x$, or $Al_2O_3$.

10. The organic light-emitting display apparatus of claim 1, further comprising a black matrix disposed between the substrate and the first pixel electrode.

11. The organic light-emitting display apparatus of claim 10, wherein the black matrix has a width equal to or greater than that of the first pixel electrode.

12. The organic light-emitting display apparatus of claim 1 further comprising a thin film transistor (TFT) disposed on the substrate, electrically connected to the first pixel electrode, and overlapping the pixel electrode in plan view.

13. The organic light-emitting display apparatus of claim 1, wherein the first pixel electrode and the opposite electrode have a reflectivity of 90% or greater.

14. The organic light-emitting display apparatus of claim 1, wherein the pixel defining layer comprises:
a first layer disposed on the first refractive layer; and
a second layer disposed on the first layer,
wherein a portion of the opposite electrode that faces the other end of the first refractive layer is inclined at an inclination angle with respect to the substrate, and a discontinuity in the inclination angle occurs at an interface between the first and the second layers of the pixel defining layer.

15. The organic light-emitting display apparatus of claim 1, further comprising:
a second pixel electrode disposed on the insulating layer and spaced apart from the first pixel electrode and
a second intermediate layer disposed on the second pixel electrode and on the insulating layer,
wherein the pixel defining layer is disposed around one end portion of the first pixel electrode and extended toward one end portion of the second pixel electrode, and comprises at least one opening that is disposed between the first pixel electrode and the second pixel electrode so as to expose the insulating layer.

16. The organic light-emitting display apparatus of claim 15, wherein the opposite electrode extends from the pixel defining layer toward a top surface of the second intermediate layer such that the opposite electrode directly contacts the insulating layer through the opening.

17. The organic light-emitting display apparatus of claim 15, wherein a portion of the opposite electrode facing the second end of the first refractive layer is disposed on a side surface of the opening.

18. An organic light-emitting display apparatus comprising:
a substrate;
an insulating layer disposed on the substrate;
a first pixel electrode disposed on the insulating layer and comprising a reflecting layer;
a pixel defining layer disposed around one end portion of the first pixel electrode and extending away from the first pixel electrode;
a first intermediate layer disposed on the first pixel electrode and comprising an organic emission layer;
an opposite electrode disposed on the first intermediate layer and the pixel defining layer and comprising a reflecting layer;
a first refractive layer disposed between the insulating layer and the pixel defining layer, the first refractive layer having a higher refractive index than the insulating layer and the pixel defining layer;
a second refractive layer disposed to directly contact a top surface of the first refractive layer and having a smaller refractive index than the first refractive layer; and
a third refractive layer disposed to directly contact a bottom surface of the first refractive layer and having a smaller refractive index than the first refractive layer,
wherein one end of the first refractive layer contacts the first intermediate layer, and the other end of the first refractive layer faces the opposite electrode.

19. The organic light-emitting apparatus of claim 18, wherein the second refractive layer has a smaller refractive index than the pixel defining layer.

20. The organic light-emitting apparatus of claim 18, wherein the third refractive layer has a smaller refractive index than the insulating layer.

* * * * *